(12) United States Patent
Navabi et al.

(10) Patent No.: US 6,239,646 B1
(45) Date of Patent: May 29, 2001

(54) HIGH-SPEED, MULTIPLE-INPUT MULTIPLEXER SCHEME

(75) Inventors: Mohammad J. Navabi; Kamal Dalmia, both of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/182,556

(22) Filed: Oct. 29, 1998

(51) Int. Cl.[7] ............................................. H03K 17/62
(52) U.S. Cl. ................................. 327/407; 327/408
(58) Field of Search .................................. 327/407, 408, 327/410, 411, 266, 274, 280, 281

(56) References Cited

U.S. PATENT DOCUMENTS 5,731,725 * 3/1998 Rothenberger et al. ............. 327/262
5,982,220 * 11/1999 Kim ..................................... 327/408

FOREIGN PATENT DOCUMENTS

0314034 * 10/1988 (EP) .

* cited by examiner

Primary Examiner—Toan Tran
Assistant Examiner—Linh Nguyen
(74) Attorney, Agent, or Firm—Christopher P. Maiorana, P.C.

(57) ABSTRACT

A circuit comprising a plurality of input devices, a plurality of select devices and a selector device. The plurality of inputs may each be configured to receive an input. The plurality of select devices may each be configured to present an output in response (i) one of said plurality of inputs and (ii) one of a plurality of select signals. The selector device may be configured to present the plurality of select signals, where only one of the select signals is active at a time.

20 Claims, 6 Drawing Sheets

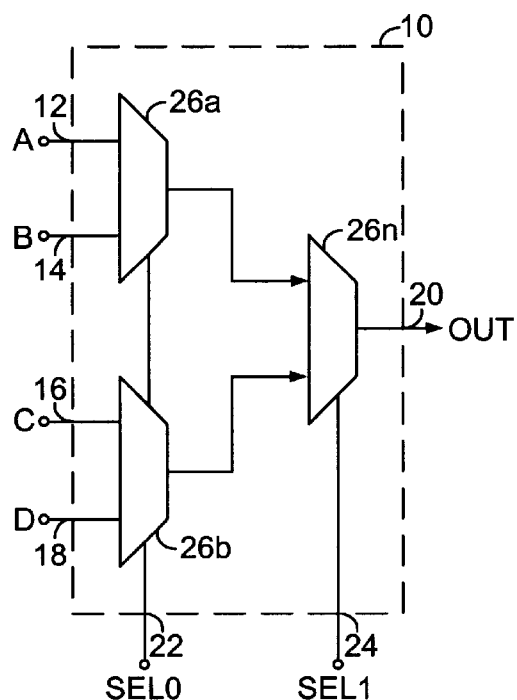
(CONVENTIONAL)
FIG. 1A
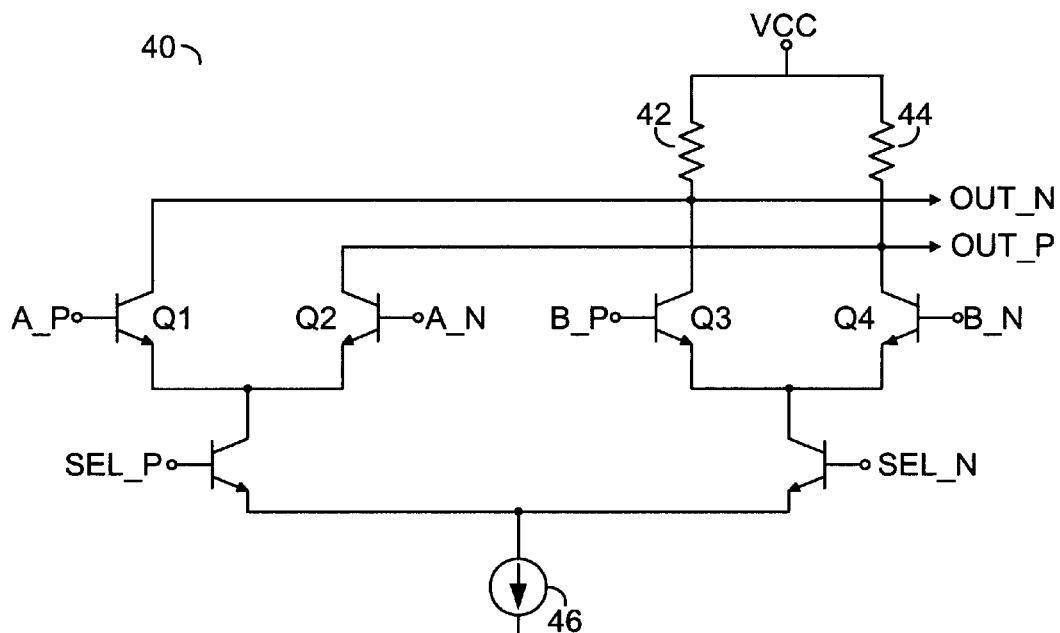
(CONVENTIONAL)
FIG. 1B

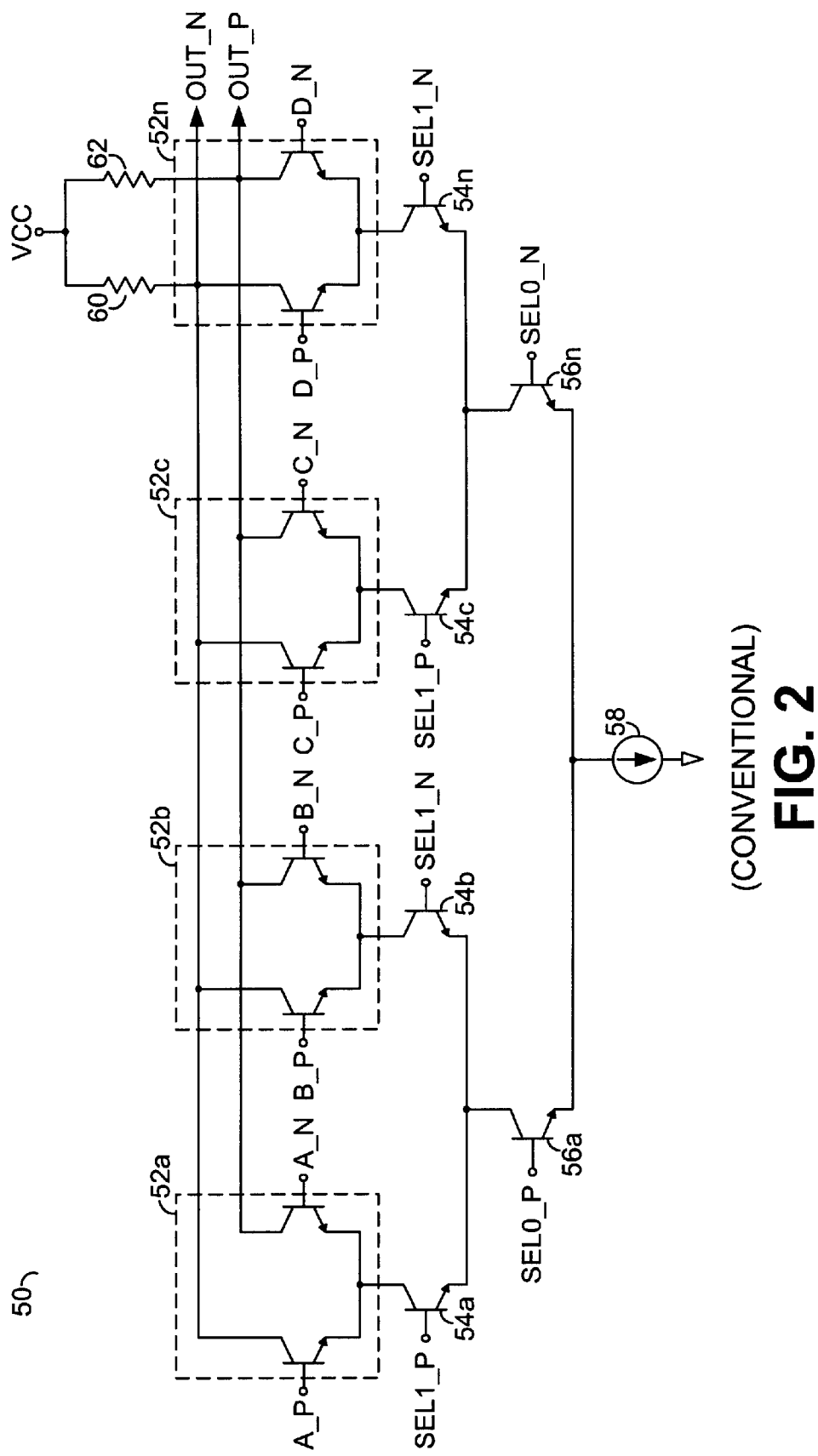
FIG. 2 (CONVENTIONAL)

HIGH-SPEED, MULTIPLE-INPUT MULTIPLEXER SCHEME

FIELD OF THE INVENTION

The present invention relates to multiplexers generally and, more particularly, to a high-speed, multiple-input multiplexer scheme.

BACKGROUND OF THE INVENTION

Multiplexers are logic devices that select between two or more inputs to be transferred to an output. It is desirable to have a multiplexer implemented with a symmetrical structure to minimize the skew when selecting between the various inputs. It is also desirable to minimize the delay introduced through the multiplexer. Additionally, it is often desirable to have a multiplexer with multiple number of inputs, in particular more than two inputs, and sometimes an odd number of inputs, while using a minimum number of components.

Referring to FIG. 1a, a circuit 10 illustrating a four input multiplexer is shown. The multiplexer 10 has an input 12, an input 14, an input 16, an input 18 and an output 20. The input 12 receives a signal A, the input 14 receives a signal B, the input 16 receives a signal C and the input 18 receives a signal D. The output 20 presents a signal OUT. The multiplexer 10 also comprises an input 22 and an input 24 that receive a select signal SEL0 and SEL1, respectively. The multiplexer 10 presents one of the signals A, B, C or D at the output 20 in response to the select signals SEL0 and SEL1.

The multiplexer 10, while performing the function of a four input multiplexer, actually comprises a number of two input multiplexers 26a–26n. The multiplexer 26a receives the signal A and the signal B and presents an output to a first input of the multiplexer 26n. The multiplexer 26b receives the signal C and the signal D and presents a signal to a second input of the multiplexer 26n. The multiplexer 26n then presents either the signal received at the first or the second input as the signal OUT. The signal SEL0 selects between the input A and B or the input C and D and the select signal SEL1 selects between the signals received by the multiplexer 26n at the first or second inputs. Using the circuit 10 to implement a multiplexer with more than four inputs, additional number of stages must be implemented. The additional stages create additional delay through the multiplexer 10 which may result in higher skew. Additionally, if the number of inputs is not equal to $2^N$, circuitry may be wasted.

Referring to FIG. 1b, a basic CML two-input multiplexer 40 is shown. A transistor Q1 receives an input A_P, a transistor Q2 receives an input A_N, a transistor Q3 receives a signal B_P and a transistor Q4 receives a signal B_N. The input A_P and A_N may be a differential input and the input B_P and B_N may be a differential input. The multiplexer 40 also comprises a resistor 42, a resistor 44, and a current source 46. The multiplexer 40 represents one of the multiplexers 26a–26n.

Referring to FIG. 2, a multiplexer 50 is shown implemented using a second conventional approach. The multiplexer 50 comprises a number of transistor pairs 52a–52n that each have a differential input (i.e., A_P and A_N; B_P and B_N; C_P and C_N; and D_P and D_N, respectively) and each have a corresponding select transistor 54a–54n. The multiplexer 50 also comprises a current source 58, a resistor 60 and a resistor 62. The select transistors 54a and 54b are connected to a second stage select transistor 56a. The select transistors 54c and 54n are connected to a second stage select transistor 56n. The second stage select transistors 56a and 56n are connected to a current source 58. At the lowest level, there is one differential pair (i.e., 56a and 56n) controlled by a pair of select lines (i.e., SEL0_P and SEL0_N). The transistors 54a–54n are stacked on top of the transistors 56a and 56n and contain two differential pairs (i.e., 54a and 54b, and 54c and 54n, respectively). The transistors 54a–54n are controlled by a second pair of select lines (i.e., SEL1_P and SEL1_N). The top level contains the four differential pairs (52a–52n). The multiplexing operation is performed by the two lower levels (i.e., the transistors 54a–54n and 56a–56n). The circuit 50 has the disadvantages of (i) requiring multiple levels of select lines, (ii) requiring additional levels of cascading to implement more than four inputs, (iii) introducing a delay to the multiplexer due to the cascading, and (iv) increasing the internal delay, which results in higher skew. Additionally, redundant circuitry is implemented if the number of inputs is not equal to $2^N$.

SUMMARY OF THE INVENTION

The present invention concerns a circuit comprising a plurality of input devices, a plurality of select devices and a selector device. The plurality of inputs may each be configured to receive an input. The plurality of select devices may each be configured to present an output in response (i) one of said plurality of inputs and (ii) one of a plurality of select signals. The selector device may be configured to present the plurality of select signals, where only one of the select signals is active at a time.

The objects, features and advantages of the present invention include providing a multiplexer that (i) employs a single stage of multiplexing to minimize the delay and supply voltage requirements associated with each stage, (ii) provides a low skew operation due to symmetrical delay and symmetrical structures, (iii) does not provide unnecessary redundant components for arbitrary (i.e., odd or non-power of 2) numbers of inputs, (iv) eliminates the need for multi-level select lines, and (v) may be implemented using either CMOS or CML technology.

BRIEF DESCRIPTION OF THE DRAWINGS

These and other objects, features and advantages of the present invention will be apparent from the following detailed description and the appended claims and drawings in which:

FIGS. 1a and 1b are block diagrams of a conventional multiplexer;

FIG. 2 is a circuit diagram of a second alternate conventional approach to a multiplexer;

DETAILED DESCRIPTION OF THE PREFERRED EMBODIMENTS

Figure 3:
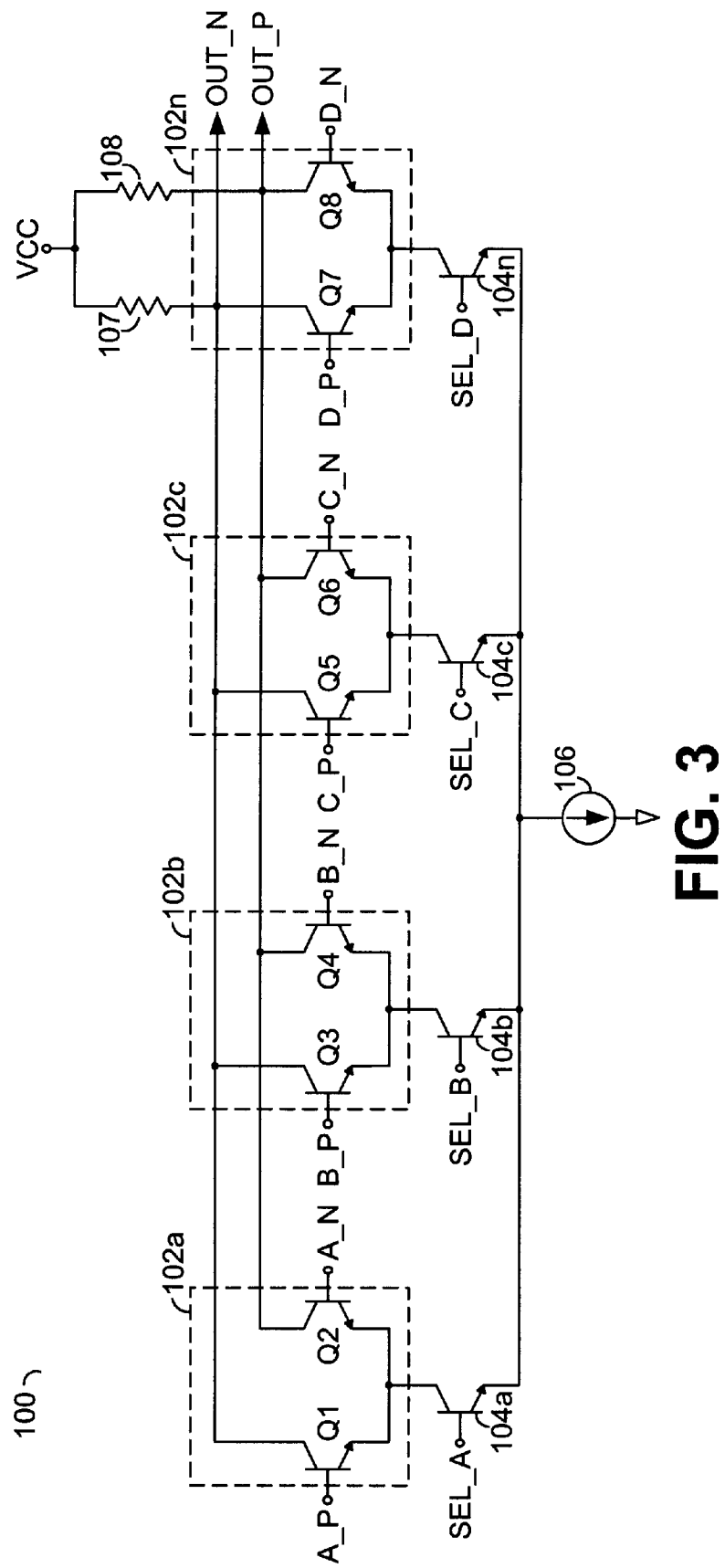
FIG. 3 is a circuit diagram illustrating the preferred embodiment of the present invention.

Referring to FIG. 3, a circuit 100 is shown in accordance with a preferred embodiment of the present invention. The circuit 100 generally comprises a number of transistor pairs 102a–102n, a number of select transistors 104a–104n, a current source 106, a resistor 107 and a resistor 108. Each of the select transistors 104a–104n may receive a select signal (e.g., SEL_A–SEL_N), respectively. The number of transistor differential pairs 102a–102n may be adjusted accordingly to meet the design criteria of a particular implementation. Only one of the select transistors 104a–104n may receive an active select signal SEL_A–SEL_N (to be described in more detail in connection with FIG. 4). The differential pairs 102a–102n generally correspond to the active select line that is transferred to the output (e.g., OUT_N and OUT_P). All of the other differential pairs 102a–102n are generally inactivated. In general, a $LOG_2$ (N) number of select lines are available for an N-input multiplexer. In such cases, a decoder is required to convert the $LOG_2$ (N) select lines to the N select lines.

The differential pair 102a generally comprises a transistor Q1 and a transistor Q2, the differential pair 102b generally comprises a transistor Q3 and a transistor Q4, the transistor pair 102c generally comprises a transistor Q5 and a transistor Q6, and the transistor pair 102n generally comprises a transistor Q7 and a transistor Q8. The number of transistor pairs 102a–102n may be adjusted accordingly to meet the design criteria of a particular implementation. For example, an odd number of differential pairs may be implemented or a number of differential pairs that is not a power of 2 (e.g., $2^N$) may be implemented. The differential pair 102a generally receives a differential input A_P and A_N. The differential pair 102b generally receives a differential input B_P and B_N. The differential pair 102c generally receives a differential input C_P and C_N. The differential pair 102n generally receives a differential input D_P and D_N. One of the differential inputs from the differential pairs 102a–102n may be presented at the output OUT_N and OUT_P in response to the select signals SEL_A, SEL_B, SEL_C and SEL_N.

Since the circuit 100 eliminates a stage of select transistors (e.g., the transistors 56a–56n of FIG. 2) that are required in conventional approaches, the overall supply voltage necessary to operate the circuit 100 may be reduced. For example, the circuit 50 would require 3*Vce of supply voltage for the selector stages, while the circuit 100 would only require 2*Vce for the selector stages. However, additional operating voltage would be required to compensate for the drop across the current source 106, the resistors 107 and the resistor 108, but this additional voltage would also be required in the circuit 50 of FIG. 2. As a result, regardless of the fine tuning of the particular Vce of the particular selector stages, the circuit 100 reduces an entire selector stage along with the corresponding supply voltage.

Figure 4:
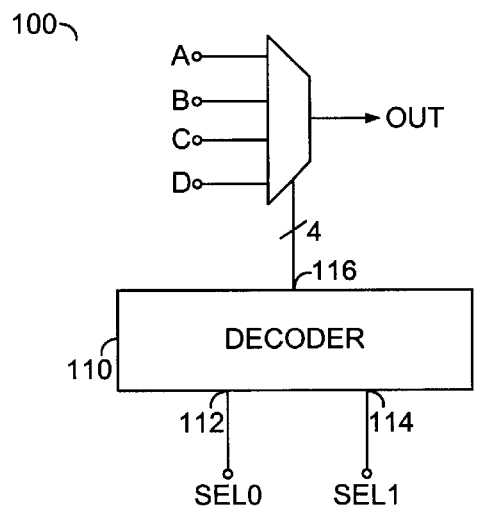
FIG. 4 is a diagram of a decoder in conjunction with the circuit of FIG. 3.

Referring to FIG. 4, an example of a decoder 110 is shown. The decoder 110 may have an input 112 and an input 114. The input 112 may receive a select signal (e.g., SEL0) and the input 114 may receive a select signal (e.g., SEL1). The decoder 110 may have an output 116 that may present a 4-bit control signal representing the select signals SEL_A–SEL_N. The decoder 110 may be implemented such that only one of the bits of the 4-bit output signal is active at a given time. One example of such a logic circuit would be a "rotating 1 counter". Such a counter traverses through its various states such that a logic "1" is "rotated" through its outputs. However, other types of decoders may be implemented such that only one of the outputs is active at a given time.

Figure 5:
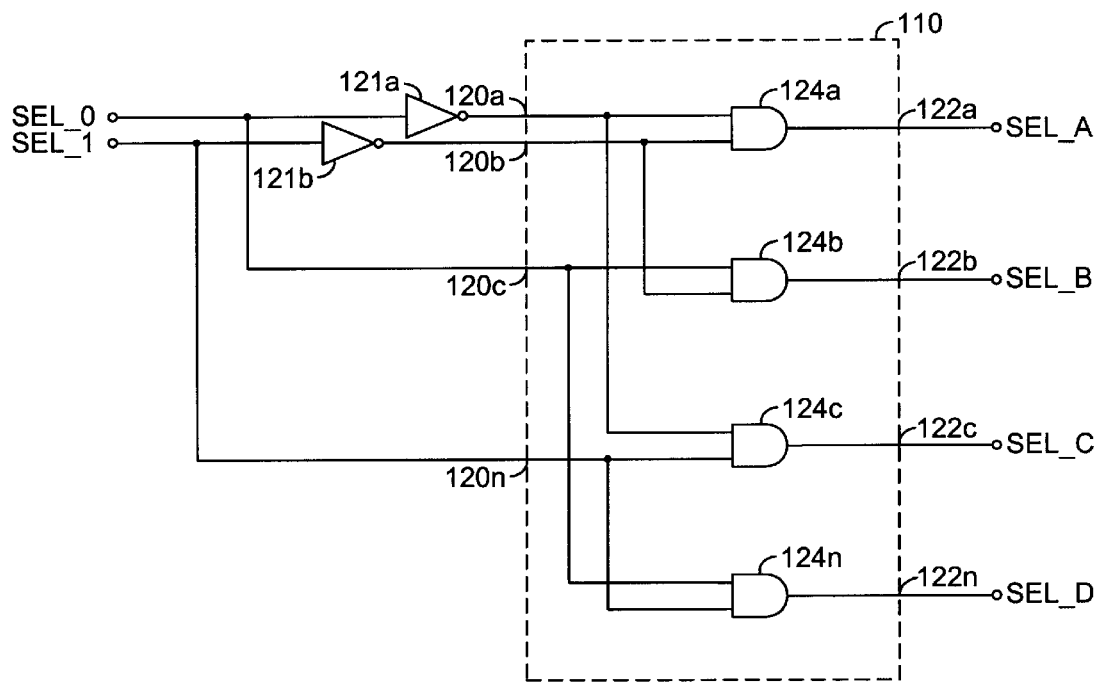
FIG. 5 is a circuit diagram of the decoder of FIG. 4.

Referring to FIG. 5, a more detailed diagram of the decoder 110 is shown. The decoder 110 generally comprises a number of inputs 120a–120n and a number of outputs 122a–122n. The input 120a generally receives a complement of a signal SEL_0 (through an inverter 121a), the input 120b generally receives a complement of a signal SEL_1 (through an inverter 121b), the input 120c generally receives the signal SEL_0 and the input 120n generally receives the signal SEL_1. The output 122a generally presents the signal SEL_A, the output 122b generally presents the signal SEL_B, the output 122c generally presents the signal SEL_C and the output 122n generally presents the signal SEL_D. The decoder 110 may also comprise a number of gates 124a–124n. The gates may be implemented using CMOS or CML logic. In general, only one of the signals presented at the outputs 122a–122n is in an active state at a given time. The following TABLE 1 illustrates an example of the inputs and the outputs of the decoder 110:

TABLE 1

| INPUTS | | OUTPUTS | | | |
|---|---|---|---|---|---|
| SEL_1 | SEL_0 | SEL_D | SEL_C | SEL_B | SEL_A |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

Figure 6:
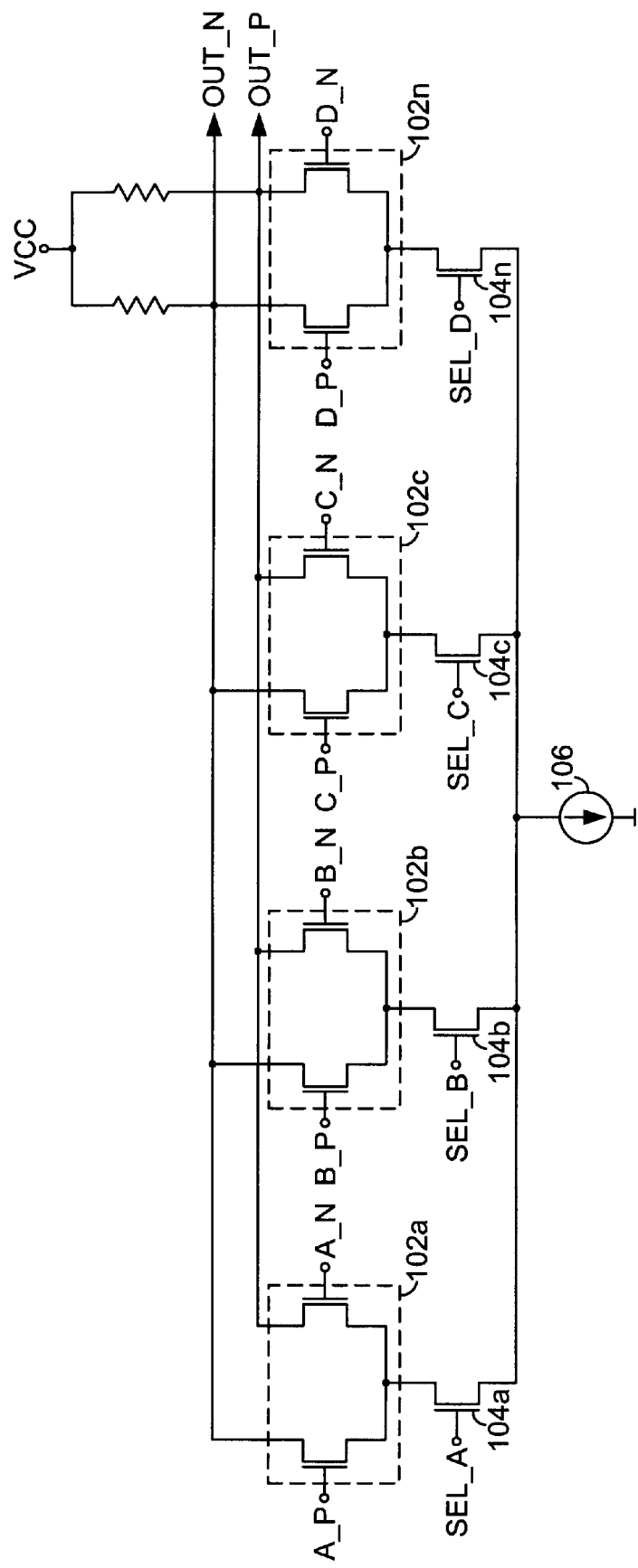
FIG. 6 is a diagram of an alternate embodiment of the present invention using NMOS logic.

Referring to FIG. 6, an example of the present invention implemented using CMOS logic, in particular NMOS transistors, is shown. The select signals SEL_A–SEL_N may generally be implemented at CMOS levels (e.g., approximately 3.3V) when implementing the devices 104a–104n using CMOS transistors.

Figure 7:
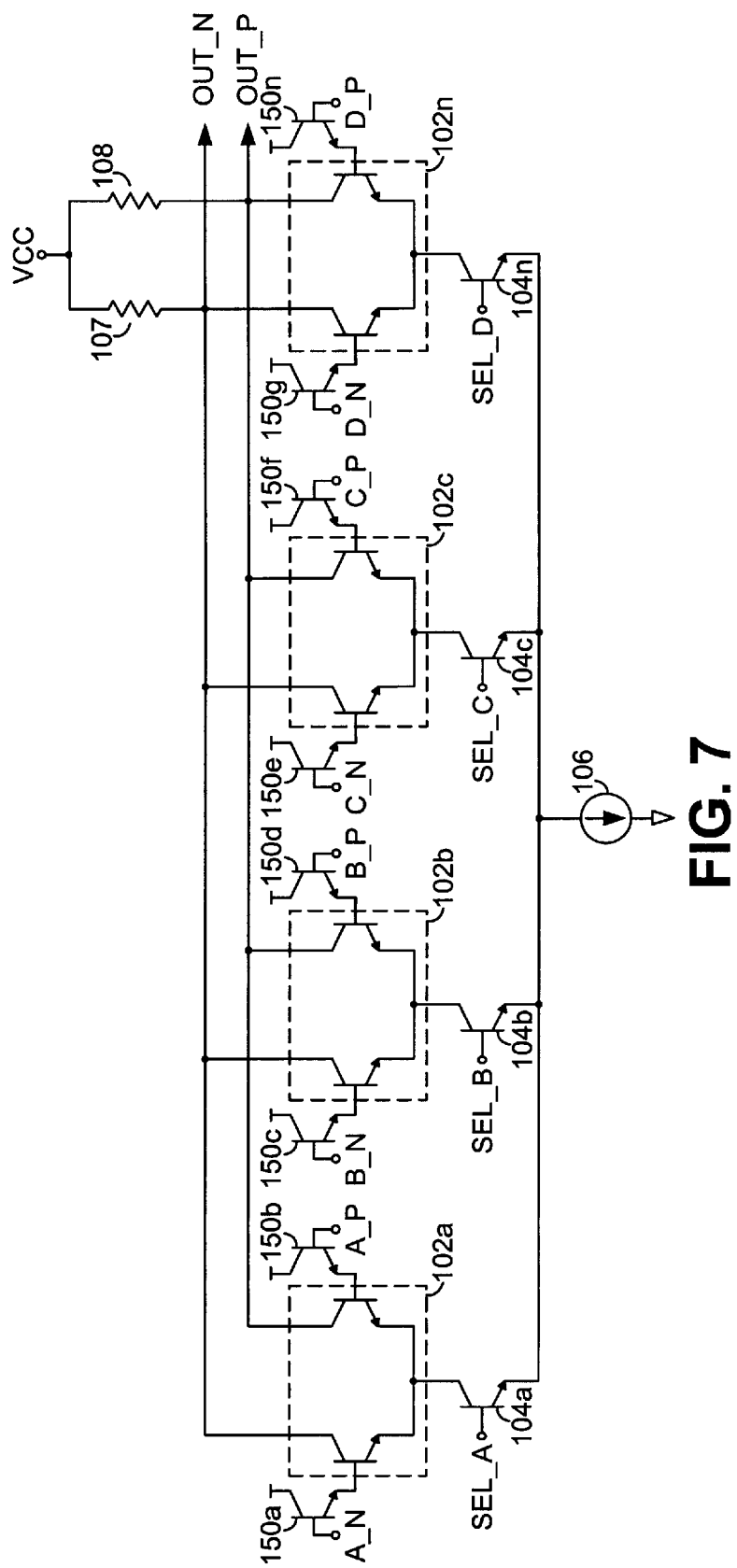
FIG. 7 is an alternate embodiment of the present invention using level shifters.

Referring to FIG. 7, an example of the present invention implementing the transistor pairs 102a–102n and the select transistors 104a–104n using CML (e.g., bipolar) devices is shown. The decoder 110 may be implemented using an NMOS/CML devices. A number of level shifters 150a–150n may also be implemented. As a result, either a CMOS level or CML level (e.g., approximately 400 mV below the supply voltage) control signal may be used to implement the select signals.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a plurality of input devices each configured to receive one of a plurality of input signals and present an output in response to (i) one of said plurality of input signals and (ii) an enabled select device, wherein the number of said plurality of input devices is greater than two;
    a plurality of select devices each (a) coupled directly between a current source and one of said plurality of input devices and (b) configured to be enabled in response to one of a plurality of select signals; and
    a selector device configured to present said plurality of select signals, wherein only one of said select signals is active at a time.

2. The circuit according to claim 1, wherein each of said plurality of input devices comprises a differential transistor pair.

3. The circuit according to claim 2, wherein each of said input signals comprises a differential input.

4. The circuit according to claim 3, wherein each of said plurality of select devices comprises a transistor coupled to one of said plurality of differential pairs, wherein the gate or base of said transistor receives said one of said plurality of said select signals.

5. The circuit according to claim 4, wherein said plurality of select devices, said plurality of input devices and said selector device are fabricated using CMOS transistors.

6. The circuit according to claim 4, wherein said plurality of select devices, said plurality of input devices and said selector device are fabricated using bipolar transistors.

7. The circuit according to claim 1, wherein said selector device comprises a decoder circuit configured to present said plurality of select signals in response to a second plurality of input signals, wherein said second plurality of input signals is less than said plurality of select signals.

8. The circuit according to claim 5, wherein said inputs are CMOS level signals.

9. The circuit according to claim 5, wherein said inputs are CML-level signals.

10. A method for generating an output signal comprising the steps of:
  (a) receiving a plurality of input signals, wherein said plurality of input signals comprises a number greater than two;
  (b) generating said output signal in response to (i) one of said plurality of input signals and (ii) one of a plurality of select signals, in response to a number of select devices each coupled directly between a current source and one of said plurality of input signals; and
  (c) generating said plurality of select signals, wherein only one of said select signals is active at a time.

11. The method according to claim 10, wherein each of said plurality of input signals each comprise a differential input.

12. The method according to claim 11, wherein step (c) generates said output signal using a plurality of transistors each coupled to one of said differential inputs, wherein a gate or base of each of said plurality of transistors receives said one of said plurality of select signals.

13. The method according to claim 12, wherein said plurality of transistors are fabricated using CMOS transistors.

14. The method according to claim 13, wherein said plurality of transistors are fabricated using bipolar transistors.

15. The method according to claim 10, wherein step (d) generates said plurality of select signals using a decoder circuit configured to present said plurality of select signals in response to a second plurality of input signals, wherein said second plurality of input signals is less than said plurality of select signals.

16. The method according to claim 13, wherein said plurality of input signals are CMOS level signals.

17. The method according to claim 13, wherein said plurality of input signals are CML-level signals.

18. The circuit according to claim 1, wherein each of said outputs comprises a differential output.

19. A circuit comprising:
  a plurality of input devices each configured to receive one of a plurality of differential input signals and present a differential output signal in response to (i) one of said plurality of input signals and (ii) an enabled select device, wherein (a) each of said plurality of input devices comprises a differential transistor pair, and (b) the number of said plurality of input devices is a number not limited to $2^N$ and is greater than two;
  a plurality of select devices each (i) coupled directly between a current source and one of said plurality of input devices and (ii) configured to be enabled in response to one of a plurality of select signals; and
  a selector device configured to present said plurality of select signals, wherein only one of said select signals is active at a time.

20. The circuit according to claim 1, wherein each of said input devices comprises a level shifter configured to receive said input signal.

* * * * *